(12) United States Patent
Liu et al.

(10) Patent No.: US 8,785,977 B2
(45) Date of Patent: Jul. 22, 2014

(54) HIGH SPEED SIGE HBT AND MANUFACTURING METHOD THEREOF

(71) Applicant: Shanghai Hua Hong Nec Electronics Co., Ltd., Shanghai (CN)

(72) Inventors: Donghua Liu, Shanghai (CN); Wenting Duan, Shanghai (CN); Wensheng Qian, Shanghai (CN); Jun Hu, Shanghai (CN); Jing Shi, Shanghai (CN)

(73) Assignee: Shanghai Hua Hong Nec Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/671,755

(22) Filed: Nov. 8, 2012

(65) Prior Publication Data

US 2014/0124838 A1    May 8, 2014

(51) Int. Cl.
 *H01L 29/66* (2006.01)
(52) U.S. Cl.
 USPC .................................. 257/197; 257/E29.033
(58) Field of Classification Search
 USPC .......................................... 257/197, E29.033
 See application file for complete search history.

(56) References Cited

U.S. PATENT DOCUMENTS

| | | | |
|---|---|---|---|
| 2002/0132438 A1* | 9/2002 | Dunn et al. | 438/343 |
| 2011/0140239 A1* | 6/2011 | Chiu et al. | 257/565 |
| 2012/0032233 A1* | 2/2012 | Qian | 257/197 |
| 2012/0064688 A1* | 3/2012 | Chen et al. | 438/312 |
| 2012/0074465 A1* | 3/2012 | Chen et al. | 257/197 |
| 2012/0091509 A1* | 4/2012 | Liu et al. | 257/197 |
| 2012/0313146 A1* | 12/2012 | Cantell et al. | 257/197 |
| 2013/0113022 A1* | 5/2013 | Qian | 257/197 |
| 2013/0134483 A1* | 5/2013 | Adkisson et al. | 257/197 |
| 2013/0214275 A1* | 8/2013 | Adkisson et al. | 257/51 |

\* cited by examiner

*Primary Examiner* — Victor A Mandala
(74) *Attorney, Agent, or Firm* — MKG, LLC

(57) ABSTRACT

A high-speed SiGe HBT is disclosed, which includes: a substrate; STIs formed in the substrate; a collector region formed beneath the substrate surface and located between the STIs; an epitaxial dielectric layer including two portions, one being located on the collector region, the other being located on one of the STIs; a base region formed both in a region between and on surfaces of the two portions of the epitaxial dielectric layer; an emitter dielectric layer including two portions, both portions being formed on the base region; an emitter region formed both in a region between and on surfaces of the two portions of the emitter dielectric layer; a contact hole formed on a surface of each of the base region, the emitter region and the collector region. A method of manufacturing high-speed SiGe HBT is also disclosed.

11 Claims, 5 Drawing Sheets

HIGH SPEED SIGE HBT AND MANUFACTURING METHOD THEREOF

CROSS-REFERENCES TO RELATED APPLICATIONS

This application relates to Chinese patent application number 201110342692.4, filed on Nov. 3, 2011, the entire contents of which are incorporated herein by reference.

TECHNICAL FIELD

The present invention relates to the field of semiconductor manufacturing, and more particularly, to a high-speed SiGe (silicon-germanium) HBT (heterojunction bipolar transistor) and manufacturing method thereof.

BACKGROUND

With the development of modern mobile communication and microwave communication as well as demands for high-performance, low-noise and low-cost radio frequency (RF) components, traditional silicon devices can no longer meet new requirements on technical specifications, output power and linearity. Therefore, SiGe HBT devices have been proposed which play an important role in the applications of high-frequency power amplifiers. Compared with gallium arsenide (GaAs) devices, though SiGe HBT devices are at a disadvantage in frequency performance, they can well solve the issue of heat dissipation accompanying with power amplification, benefiting from their better thermal conductivities and good mechanical capacities of their substrates. Moreover, SiGe HBT devices also have better linearity and higher integration level. Further, SiGe HBT devices are well compatible with the conventional silicon process and still belong to the silicon-based technology and the complementary metal oxide semiconductor (CMOS) process, thus reducing manufacturing cost. For these reasons, the SiGe BiCMOS (bipolar complementary metal oxide semiconductor) process provides great convenience for the integration of power amplifiers and logic control circuits.

Currently, SiGe HBT devices have been widely adopted internationally as high-frequency, high-power amplifier devices for wireless communication products such as power amplifiers and low-noise amplifiers used in mobile phones. In order to improve the output power of an RF power amplifier, it is an effective practice to increase its operating current or operating voltage within the normal operating ranges. Moreover, it is also important to reduce a SiGe HBT device's power consumption and improve its maximum oscillation frequency to reduce the resistance of its collector region through improvements in various kinds of process and device designs. Moreover, component miniaturization is also an important means to increase the integration level of integrated circuits, reduce some parasitic parameters (for example, base region resistance, collector region resistance, capacitances, etc.), and improve device performances.

Referring to FIG. 1, a SiGe HBT device of the prior art is fabricated according to the following steps: forming a buried layer 2 in a substrate 1; forming an epitaxial layer 3 on the buried layer 2; forming shallow trench isolations (STIs) 4 in the epitaxial layer 3; forming deep trench isolations (DTIs) 16 between the buried layer 2 and the substrate 1; forming a collector region 15 in the region located between the two inner STIs 4; implanting an impurity into the region between each of the two inner STIs 4 and an outer STI 4 adjacent thereto so as to form ion-implanted regions 5 on the buried layer 2; picking up electrodes of the collector region 15 through contact holes 7 formed on the ion-implanted regions 5; forming a base dielectric layer 14 on each of the two inner STIs, and forming a SiGe epitaxial layer in the region located between and on the base dielectric layers 14 to form a base region, which is composed of an intrinsic base region 12 and extrinsic base regions 9; and picking up electrodes of the base region through contact holes 7 formed on the extrinsic base regions 9.

In the above SiGe HBT of the prior art, the buried layer 2 and the ion-implanted regions 5 used to pick up the collector region will both increase the area of the device. Moreover, the practice of picking up the electrodes of the base region by using a bilateral symmetrical structure will also lead to the increase of the capacitance of the base-collector junction.

SUMMARY OF THE INVENTION

An objective of the present invention is to provide a high-speed SiGe HBT and manufacturing method thereof so as to reduce the device area, the capacitance of base-collector junction and the manufacturing cost.

To achieve the above objective, the present invention provides a high-speed SiGe HBT, including: a substrate; shallow trench isolations formed in the substrate; a collector region formed beneath a surface of the substrate and located between the shallow trench isolations; an epitaxial dielectric layer including two portions, a first one of the portions being located on the collector region, a second one of the portions being located on one of the shallow trench isolations; a base region formed both in a region between the two portions of the epitaxial dielectric layer and on surfaces of the two portions of the epitaxial dielectric layer; an emitter dielectric layer including two portions, both portions being formed on the base region; an emitter region formed both in a region between the two portions of the emitter dielectric layer and on surfaces of the two portions of the emitter dielectric layer; and a contact hole, formed on a surface of each of the base region, the emitter region and the collector region.

Preferably, the emitter region is formed on the surface of the base region and is located above the collector region.

Preferably, the above high-speed SiGe HBT further includes base region isolation sidewalls that are formed on both sides of the base region and the epitaxial dielectric layer.

Preferably, the above high-speed SiGe HBT further includes emitter region isolation sidewalls that are formed on both sides of the emitter region and the emitter dielectric layer.

Preferably, the above high-speed SiGe HBT further includes metal wires, each metal wire being connected to one of the contact holes.

Preferably, the substrate is a P-type substrate; the collector region contains an N-type impurity; the emitter region contains an N-type impurity; and the base region contains a P-type impurity.

Preferably, a thickness of the epitaxial dielectric layer is 50 Å to 300 Å.

Preferably, the epitaxial dielectric layer and the emitter dielectric layer are both formed of an insulating material.

Another aspect of the present invention provides a method of manufacturing high-speed SiGe HBT, which includes the following steps:

forming shallow trench isolations in a substrate;

implanting an impurity in a region between the shallow trench isolations to form a collector region;

depositing a first dielectric layer and removing a portion of the first dielectric layer by using an etching process to expose a portion of the collector region and a portion of the shallow trench isolation adjacent to the exposed portion of the collector region;

growing a SiGe epitaxial layer on a surface of the substrate;

depositing a second dielectric layer and removing a portion of the second dielectric layer by using an etching process to form an emitter window;

depositing an emitter polysilicon into the emitter window and on the second dielectric layer, implanting an impurity into the emitter polysilicon and etching the emitter polysilicon and the second dielectric layer to form an emitter region and an emitter dielectric layer, respectively;

implanting an impurity into the SiGe epitaxial layer and etching the SiGe epitaxial layer and the first dielectric layer to form a base region and an epitaxial dielectric layer, respectively; and forming a contact hole on a surface of each of the base region, the emitter region and the collector region.

Preferably, the above method further includes forming base region isolation sidewalls on both sides of the base region and the epitaxial dielectric layer.

Preferably, the above method further includes forming emitter region isolation sidewalls on both sides of the emitter region and the emitter dielectric layer.

Preferably, the above method further includes connecting each contact hole to a metal wire.

Preferably, the substrate is a P-type substrate.

Preferably, the impurity implanted into the region between the shallow trench isolations is an N-type impurity which is implanted with an implantation dose of $1e^{12}$ cm$^{-2}$ to $5e^{14}$ cm$^{-2}$ and an implantation energy of 20 KeV to 400 KeV.

Preferably, the impurity implanted into the emitter polysilicon is an N-type impurity which is implanted with an implantation dose of $5e^{14}$ cm$^{-2}$ to $1e^{16}$ cm$^{-2}$ and an implantation energy of 20 KeV to 400 KeV.

Preferably, the impurity implanted into the base region is a P-type impurity which is implanted with an implantation dose of $5e^{14}$ cm$^{-2}$ to $1e^{16}$ cm$^{-2}$ and an implantation energy of 5 KeV to 20 KeV.

Preferably, a thickness of the epitaxial dielectric layer is 50 Å to 300 Å.

Compared with the prior art, the present invention gives up utilizing a buried layer that is always adopted in conventional devices, instead, exposes a portion of the collector region and directly picks up the collector region through a contact hole formed on the exposed portion of the collector region. Moreover, as there is no buried layer formed on the substrate, the epitaxial layer and the deep trench isolations in conventional devices are also eliminated. Further, the electrode of the base region is picked up by using a unilateral structure rather than the conventional bilateral symmetrical structure. Thus, the present invention is not only capable of reducing the device area and the capacitance of the base-collector junction, but also can reduce the manufacturing cost and simplify the structure of the device. In addition, the method of forming the collector region by directly implanting an impurity into the region between the STIs may further contribute to the reduction of manufacturing cost.

BRIEF DESCRIPTION OF THE DRAWINGS

The present invention will be further described and specified by using figures and implementation details as follows.

DETAILED DESCRIPTION

The above objects, features and advantages of the present invention will be more apparent in the course of the following description on embodiments made with reference to accompanying drawings.

Details given in the following description are intended only for a better understanding on the present invention. The present invention can be carried out in other embodiments different with those described below, and those skilled in the art can make various modifications without departing from the spirit or scope of the invention. Thus, the present invention is not limited to the exemplary embodiments as described below.

Figure 1:
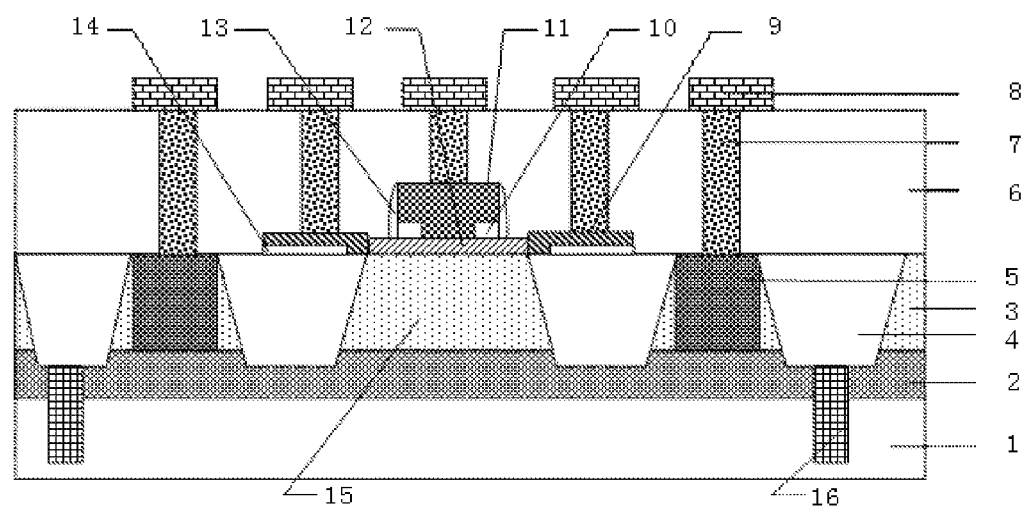
FIG. 1 is a schematic view illustrating a SiGe HBT of the prior art.
Figure 2:
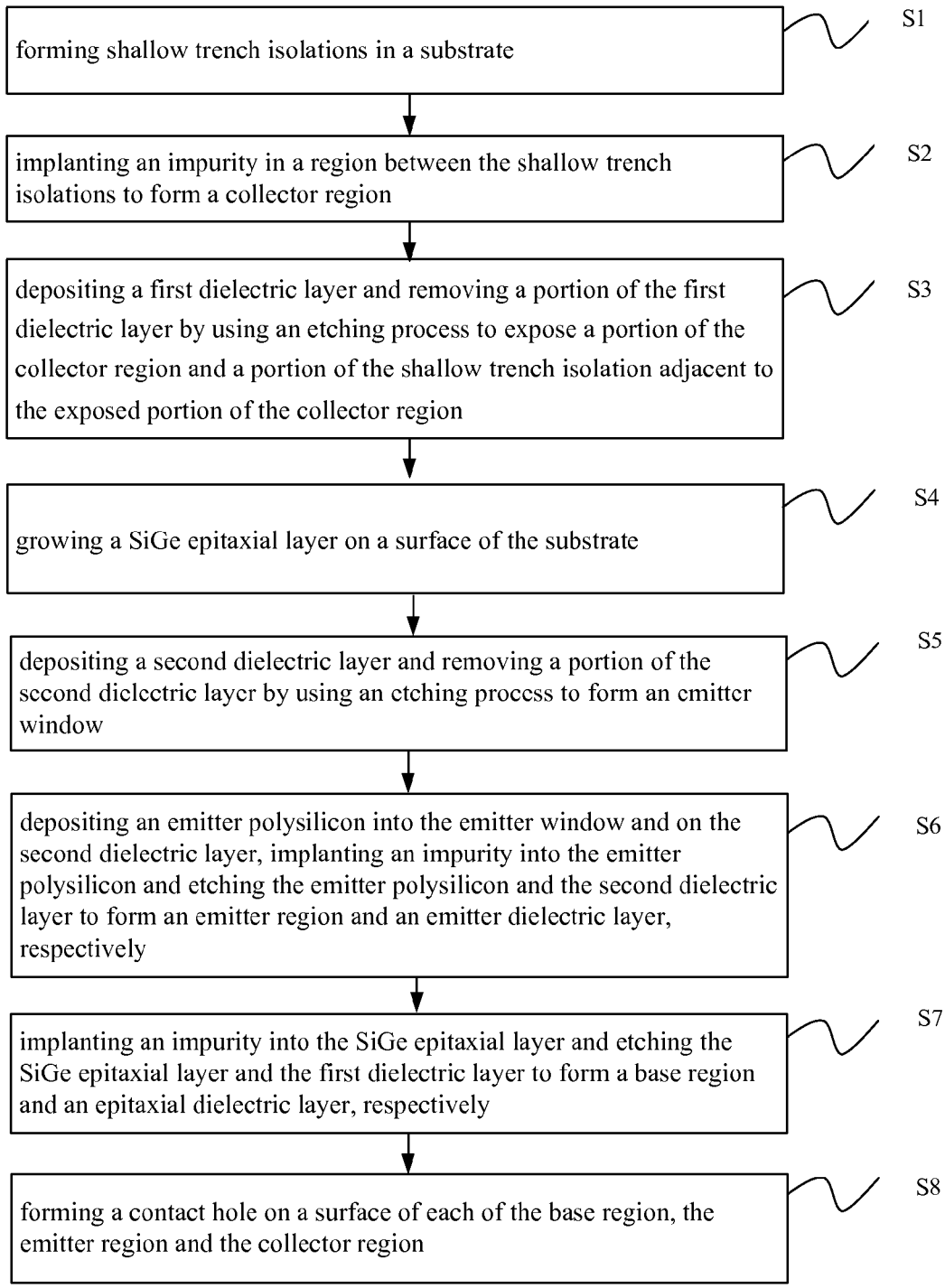
FIG. 2 is a flow chart illustrating the method of manufacturing high-speed SiGe HBT according to an embodiment of the present invention.
Figure 3:
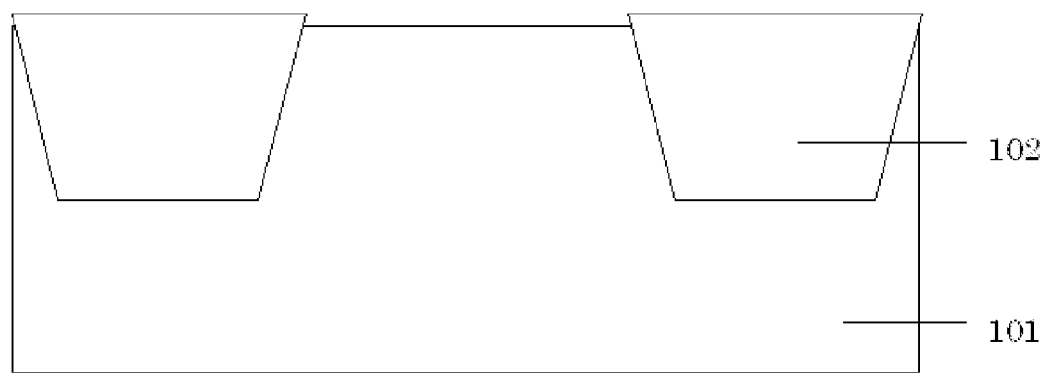
FIGS. 3 to 8 are cross-sectional schematic diagrams illustrating the structure of the high-speed SiGe HBT during various steps of the manufacturing method according to an embodiment of the present invention.
Figure 4:
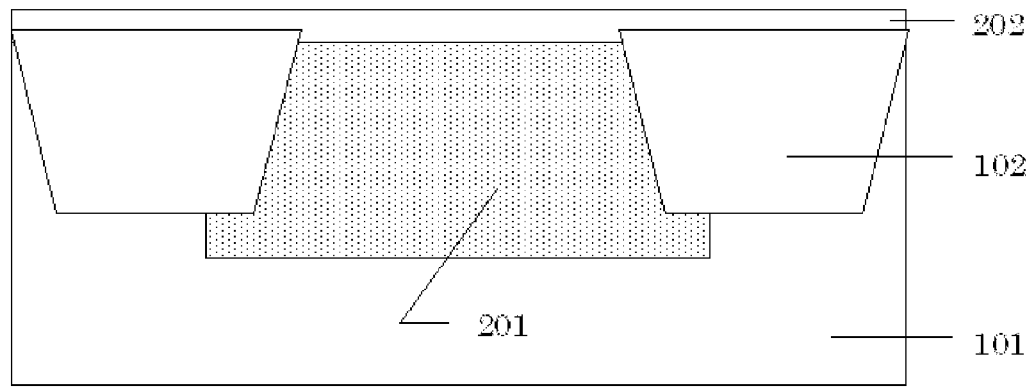
Figure 5:
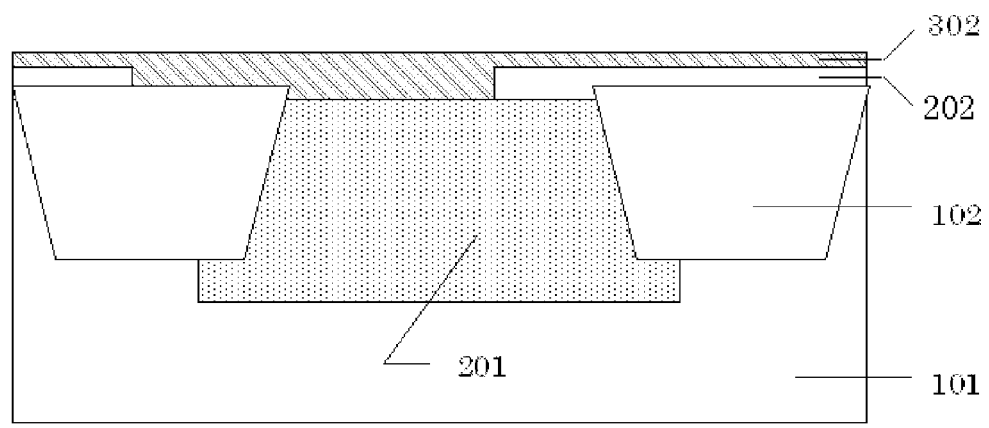
Figure 6:
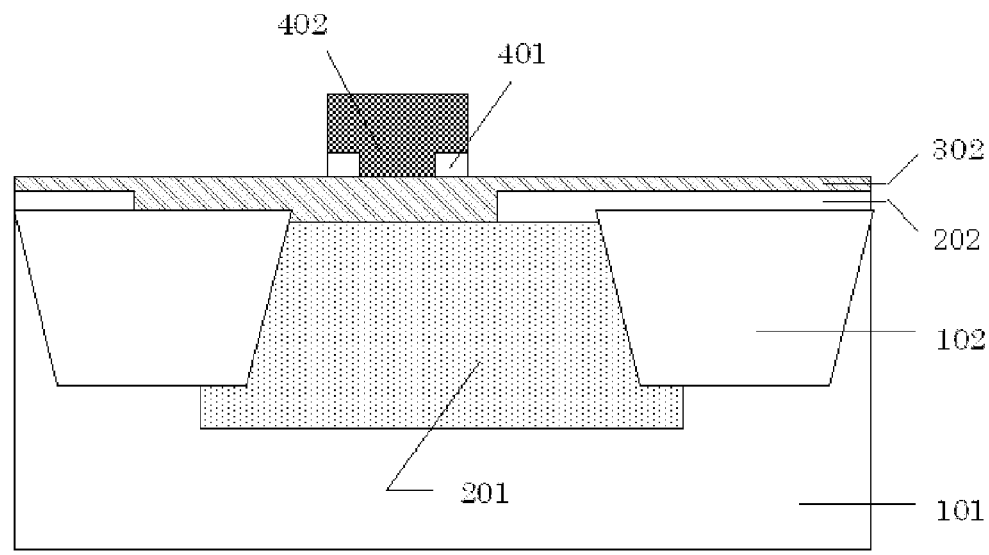
Figure 7:
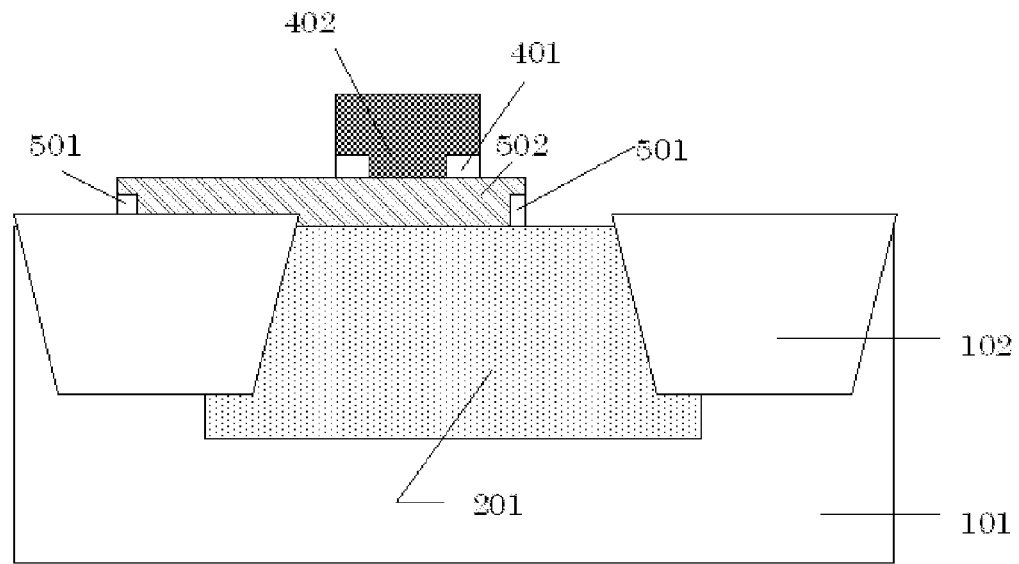

Detailed analysis on a method of manufacturing high-speed SiGe HBT of the present invention will be made below by taking the flow chart shown in FIG. 2 as an example while giving reference to FIGS. 3 to 8. The method includes the following steps:

S1: See FIG. 3, form shallow trench structures in a substrate 101 and fill oxide into each of the shallow trench structures to form shallow trench isolations 102.

Preferably, the substrate 101 is a P-type substrate.

S2: See FIG. 4, implant an impurity in a region between the STIs 102 to form a collector region 201.

S3: See FIG. 4, deposit a first dielectric layer 202 on the STIs 102 and the collector region 201; See FIG. 5, remove a portion of the first dielectric layer 202 by using an etching process so as to form a window therein which exposes a portion of the collector region 201 and a portion of the STI 102 adjacent to the exposed portion of the collector region 201.

In this step, the impurity implanted into the collector region 201 is an N-type impurity. And preferably, the N-type impurity implanted into the collector region 201 is phosphorus or arsenic which is implanted with an implantation dose of $1e^{12}$ cm$^{-2}$ to $5e^{14}$ cm$^{-2}$ and an implantation energy of 20 KeV to 400 KeV. The first dielectric layer 202 has a thickness of 50 Å to 300 Å.

S4: See FIG. 5, grow a SiGe epitaxial layer 302 on a surface of the substrate, or in other words, the SiGe epitaxial layer 302 fills the window and covers the first dielectric layer 202.

S5: See FIG. 6, deposit a second dielectric layer on the SiGe epitaxial layer 302 and remove a portion of the second dielectric layer by using an etching process so as to form an emitter window.

In this embodiment, the first dielectric layer 202 and the second dielectric layer are both formed of an insulating material. In this embodiment, the insulating material is silicon dioxide.

S6: See FIG. 6, deposit an emitter polysilicon into the emitter window and on the second dielectric layer; implant an impurity into the emitter polysilicon; and etch the emitter polysilicon and the second dielectric layer to form an emitter region 402 and an emitter dielectric layer 401, respectively.

In this step, the impurity implanted into the emitter polysilicon is an N-type impurity. And preferably, the N-type impurity implanted into the emitter polysilicon is phosphorus or arsenic which is implanted with an implantation dose of $5e^{14}$ cm$^{-2}$ to $1e^{16}$ cm$^{-2}$ and an implantation energy of 20 KeV to 400 KeV.

S7: See FIG. 7, implant an impurity into the SiGe epitaxial layer 302 and etch the SiGe epitaxial layer 302 and the first dielectric layer 202 to form a base region 502 and an epitaxial dielectric layer 501, respectively.

In this step, the impurity implanted into the SiGe epitaxial layer 302 (namely, the base region) is a P-type impurity. And preferably, the P-type impurity implanted into the SiGe epitaxial layer 302 is boron or boron difluoride which is implanted with an implantation dose of $5e^{14}$ cm$^{-2}$ to $1e^{16}$ cm$^{-2}$ and an implantation energy of 5 KeV to 20 KeV.

Moreover, as the epitaxial dielectric layer 501 is formed of the first dielectric layer 202, the epitaxial dielectric layer 501 also has a thickness of 50 Å to 300 Å.

S8: See FIG. 8, form a contact hole 701 on a surface of each of the base region 502, the emitter region 402 and the collector region 201.

Figure 8:
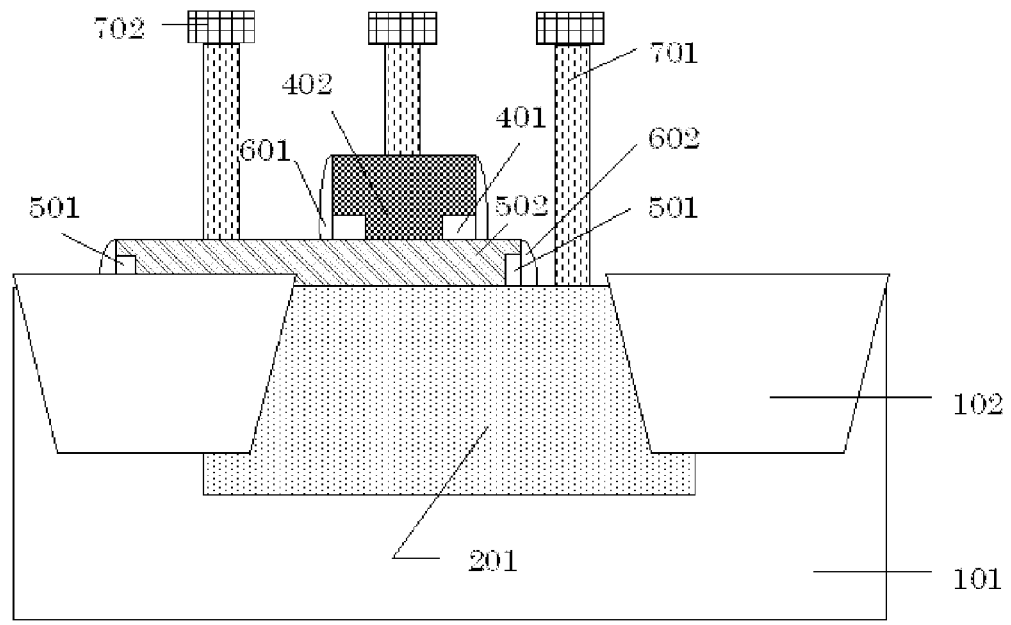

Further, see FIG. 8, base region isolation sidewalls 602 are formed on both sides of the base region 502 and the epitaxial dielectric layer 501.

Further, see FIG. 8, emitter region isolation sidewalls 601 are formed on both sides of the emitter region 402 and the emitter dielectric layer 401.

Further, see FIG. 8, a base electrode, an emitter electrode and a collector electrode are picked up by the contact holes 701 formed on the base region, the emitter region and the collector region, respectively, and each contact hole is connected to a metal wire 702.

As shown in FIG. 8, the present invention also provides a high-speed SiGe HBT, which includes:

a substrate 101;

shallow trench isolations 102 which are formed in the substrate 101;

a collector region 201 which is formed beneath a surface of the substrate 101 and located between the shallow trench isolations 102;

an epitaxial dielectric layer 501 which includes two portions, and a first one of the portions is located on the collector region 201 and a second one of the portions is located on one of the STIs 102 (in this embodiment, the STI on the left);

a base region 502 which is formed both in a region between the two portions of the epitaxial dielectric layer 501 and on surfaces of the two portions of the epitaxial dielectric layer 501;

an emitter dielectric layer 401 which includes two portions, and both portions are formed on the base region 502;

an emitter region 402 which is formed both in a region between the two portions of the emitter dielectric layer 502 and on surfaces of the two portions of the emitter dielectric layer 502; and a contact hole 701 which is formed on a surface of each of the base region 502, the emitter region 402 and the collector region 201.

Preferably, in the high-speed SiGe HBT, the emitter region 402 is formed on the surface of the base region 502 and is located above the collector region 201.

In this embodiment, the high-speed SiGe HBT further includes base region isolation sidewalls 602 that are formed on both sides of the base region 502 and the epitaxial dielectric layer 501.

In this embodiment, the high-speed SiGe HBT further includes emitter region isolation sidewalls 602 that are formed on both sides of the emitter region 402 and the emitter dielectric layer 401.

In this embodiment, the high-speed SiGe HBT further includes metal wires 702, and each metal wire is connected to one of the contact holes 701.

Preferably, the substrate 101 is a P-type substrate; both the collector region 201 and the emitter region 402 contain an N-type impurity, but the base region 502 contains a P-type impurity. And preferably, the N-type impurity contained by the collector region 201 and the emitter region 402 is phosphorus or arsenic, and the P-type impurity contained by the base region 502 is boron or boron difluoride. Moreover, the epitaxial dielectric layer 501 has a thickness of 50 Å to 300 Å.

Preferably, the epitaxial dielectric layer 501 and the emitter dielectric layer 401 are both formed of an insulating material. And in this embodiment, the insulating material is silicon dioxide.

Compared with the prior art, the present invention gives up utilizing a buried layer that is always adopted in conventional devices, instead, exposes a portion of the collector region and directly picks up the collector region through a contact hole formed on the exposed portion of the collector region. Moreover, as there is no buried layer formed on the substrate, the epitaxial layer and the deep trench isolations in conventional devices are also eliminated. Further, the electrode of the base region is picked up by using a unilateral structure rather than the conventional bilateral symmetrical structure. Thus, the present invention is not only capable of reducing the device area and the capacitance of the base-collector junction, but also can reduce the manufacturing cost and simplify the structure of the device. In addition, the method of forming the collector region by directly implanting an impurity into the region between the STIs may further contribute to the reduction of manufacturing cost.

The above embodiments are provided as examples for the purpose of describing the principle and effects of the invention and are not intended to limit the scope of the invention in any way. It will be apparent to those skilled in the art that various modifications and variations can be made without departing from the spirit or scope of the invention. Thus, it is intended that the present invention covers the modifications and variations of this invention provided they fall within the scope of the following claims and their equivalents.

What is claimed is:

1. A high-speed SiGe HBT, comprising:
   a substrate;
   shallow trench isolations formed in the substrate;
   a collector region formed beneath a surface of the substrate and located between the shallow trench isolations;
   an epitaxial dielectric layer including two portions, a first one of the portions being located on the collector region, a second one of the portions being located on one of the shallow trench isolations;
   a base region formed both in a region between the two portions of the epitaxial dielectric layer and on surfaces of the two portions of the epitaxial dielectric layer;
   an emitter dielectric layer including two portions, both portions being formed on the base region;
   an emitter region formed both in a region between the two portions of the emitter dielectric layer and on surfaces of the two portions of the emitter dielectric layer; and
   a contact hole, formed on a surface of each of the base region, the emitter region and the collector region.

2. The high-speed SiGe HBT according to claim 1, wherein the emitter region is formed on the surface of the base region and is located above the collector region.

3. The high-speed SiGe HBT according to claim 1, further comprising base region isolation sidewalls that are formed on both sides of the base region and the epitaxial dielectric layer.

4. The high-speed SiGe HBT according to claim 1, further comprising emitter region isolation sidewalls that are formed on both sides of the emitter region and the emitter dielectric layer.

5. The high-speed SiGe HBT according to claim 1, further comprising metal wires, each metal wire being connected to one of the contact holes.

6. The high-speed SiGe HBT according to claim 1, wherein the substrate is a P-type substrate.

7. The high-speed SiGe HBT according to claim 6, wherein the collector region contains an N-type impurity.

8. The high-speed SiGe HBT according to claim 6, wherein the emitter region contains an N-type impurity.

9. The high-speed SiGe HBT according to claim 6, wherein the base region contains a P-type impurity.

10. The high-speed SiGe HBT according to claim 1, wherein a thickness of the epitaxial dielectric layer is 50 Å to 300 Å.

11. The high-speed SiGe HBT according to claim 1, wherein the epitaxial dielectric layer and the emitter dielectric layer are both formed of an insulating material.

\* \* \* \* \*